(12) United States Patent
Campbell et al.

(10) Patent No.: US 8,490,679 B2
(45) Date of Patent: Jul. 23, 2013

(54) CONDENSER FIN STRUCTURES FACILITATING VAPOR CONDENSATION COOLING OF COOLANT

(75) Inventors: Levi A. Campbell, Poughkeepsie, NY (US); Richard C. Chu, Poughkeepsie, NY (US); Michael J. Ellsworth, Jr., Poughkeepsie, NY (US); Madhusudan K. Iyengar, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1063 days.

(21) Appl. No.: 12/491,286

(22) Filed: Jun. 25, 2009

(65) Prior Publication Data

US 2010/0326628 A1 Dec. 30, 2010

(51) Int. Cl.
*F28F 7/00* (2006.01)
*F28D 15/00* (2006.01)
*H01L 23/34* (2006.01)
*H05K 7/20* (2006.01)

(52) U.S. Cl.
USPC ............... 165/80.2; 165/104.21; 165/104.26; 165/104.33; 257/714; 361/710

(58) Field of Classification Search
USPC ............... 165/104.21, 104.26, 104.33, 80.2, 165/80.3, 80.4, 181, 182, 183, 184, 185; 257/714; 361/710
See application file for complete search history.

(56) References Cited

U.S. PATENT DOCUMENTS

| 2,643,282 | A | 6/1953 | Greene |
| 2,942,165 | A | 6/1960 | Jackson et al. |
| 3,109,485 | A | 11/1963 | Fortier |
| 3,222,580 | A | 12/1965 | Curll |
| 3,616,533 | A | 11/1971 | Heap et al. |
| 4,064,300 | A | 12/1977 | Bhangu |
| 4,108,242 | A | 8/1978 | Searight et al. |

(Continued)

FOREIGN PATENT DOCUMENTS

| JP | 8-254512 A | 10/1996 |
| JP | 09-116056 A | 5/1997 |
| JP | 2002-026201 A | 1/2002 |
| TW | 319406 | 11/1997 |

OTHER PUBLICATIONS

Notice of Allowance for U.S. Appl. No. 12/491,281 (U.S. Patent Publication No. 2010/0328889 A1), dated Feb. 11, 2011.

(Continued)

*Primary Examiner* — Ljiljana Ciric
(74) *Attorney, Agent, or Firm* — Dennis Jung, Esq.; Kevin P. Radigan, Esq.; Heslin Rothenberg Farley & Mesiti P.C.

(57) ABSTRACT

Vapor condensers and cooling apparatuses to facilitate vapor condensation cooling of a coolant employed in cooling an electronic device or electronic subsystem. The vapor condenser includes a thermally conductive base structure having an operational orientation when the condenser is facilitating vapor condensate formation, and a plurality of thermally conductive condenser fins extending from the thermally conductive base structure. The plurality of thermally conductive condenser fins have a varying cross-sectional perimeter along at least a portion of their length. The cross-sectional perimeters of the plurality of thermally conductive condenser fins are configured to increase in a direction of condensate travel.

14 Claims, 11 Drawing Sheets

U.S. PATENT DOCUMENTS

| | | | |
|---|---|---|---|
| 4,166,498 A * | 9/1979 | Fujie et al. | 165/181 |
| 4,195,688 A * | 4/1980 | Fujie et al. | 165/184 |
| 4,201,195 A | 5/1980 | Sakhuja | |
| 4,245,695 A * | 1/1981 | Fujikake | 165/184 |
| 4,323,914 A | 4/1982 | Berndlmaier et al. | |
| 4,622,946 A | 11/1986 | Hurley et al. | |
| 4,750,086 A | 6/1988 | Mittal | |
| 4,833,567 A | 5/1989 | Saaski et al. | |
| 5,006,924 A | 4/1991 | Frankeny et al. | |
| 5,054,548 A * | 10/1991 | Zohler | 165/184 |
| 5,063,476 A | 11/1991 | Hamadah et al. | |
| 5,126,919 A | 6/1992 | Yamamoto et al. | |
| 5,168,919 A | 12/1992 | Berenholz et al. | |
| 5,183,104 A | 2/1993 | Novotny | |
| 5,220,804 A | 6/1993 | Tilton et al. | |
| 5,308,920 A | 5/1994 | Itoh | |
| 5,349,831 A | 9/1994 | Daikiku et al. | |
| 5,351,748 A | 10/1994 | Dagan | |
| 5,411,077 A | 5/1995 | Tousignant | |
| 5,508,884 A | 4/1996 | Brunet et al. | |
| 5,513,699 A * | 5/1996 | Menze et al. | 165/184 |
| 5,597,039 A * | 1/1997 | Rieger | 165/184 |
| 5,608,610 A | 3/1997 | Brzezinki | |
| 5,634,351 A | 6/1997 | Larson et al. | |
| 5,718,117 A | 2/1998 | McDunn et al. | |
| 5,720,338 A | 2/1998 | Larson et al. | |
| 5,726,495 A | 3/1998 | Aihara et al. | |
| 5,781,411 A | 7/1998 | Feenstra | |
| 5,803,165 A * | 9/1998 | Shikazono et al. | 165/184 |
| 5,854,092 A | 12/1998 | Root et al. | |
| 5,963,425 A | 10/1999 | Chrysler et al. | |
| 6,000,908 A | 12/1999 | Bunker | |
| 6,134,108 A | 10/2000 | Patel et al. | |
| 6,134,783 A | 10/2000 | Bargman et al. | |
| 6,164,370 A * | 12/2000 | Robinson et al. | 165/184 |
| 6,193,905 B1 | 2/2001 | Yamada et al. | |
| 6,237,223 B1 | 5/2001 | McCullough | |
| 6,298,909 B1 * | 10/2001 | Fukatami et al. | 165/183 |
| 6,366,462 B1 | 4/2002 | Chu et al. | |
| 6,378,605 B1 | 4/2002 | Kutscher et al. | |
| 6,431,260 B1 | 8/2002 | Agonafer et al. | |
| 6,474,074 B2 | 11/2002 | Ghoshal | |
| 6,490,160 B2 | 12/2002 | Dibene et al. | |
| 6,519,151 B2 | 2/2003 | Chu et al. | |
| 6,549,408 B2 | 4/2003 | Berchowitz | |
| 6,550,263 B2 | 4/2003 | Patel et al. | |
| 6,550,531 B1 | 4/2003 | Searls et al. | |
| 6,571,569 B1 | 6/2003 | Rini et al. | |
| 6,637,212 B2 * | 10/2003 | Torres et al. | 62/50.2 |
| 6,817,196 B2 | 11/2004 | Malone et al. | |
| 6,817,405 B2 | 11/2004 | Kamath et al. | |
| 6,883,597 B2 * | 4/2005 | Thors et al. | 165/183 |
| 6,892,798 B2 * | 5/2005 | Lee et al. | 165/104.12 |
| 6,918,435 B2 | 7/2005 | Dwyer | |
| 6,926,071 B2 | 8/2005 | Lee et al. | |
| 6,938,678 B1 | 9/2005 | Bortolini et al. | |
| 6,938,680 B2 | 9/2005 | Garner et al. | |
| 6,992,888 B1 | 1/2006 | Iyer | |
| 7,077,189 B1 | 7/2006 | Reyzin et al. | |
| 7,079,393 B2 | 7/2006 | Colgan et al. | |
| 7,134,289 B2 | 11/2006 | Patel et al. | |
| 7,254,030 B2 | 8/2007 | Chiba et al. | |
| 7,284,389 B2 | 10/2007 | Sharma et al. | |
| 7,307,841 B2 | 12/2007 | Berlin et al. | |
| 7,311,137 B2 * | 12/2007 | Thors et al. | 165/184 |
| 7,349,213 B2 | 3/2008 | Campbell et al. | |
| 7,357,173 B2 | 4/2008 | Griesmayer | |
| 7,362,574 B2 | 4/2008 | Campbell et al. | |
| 7,365,981 B2 | 4/2008 | Myers et al. | |
| 7,369,410 B2 | 5/2008 | Chen et al. | |
| 7,375,962 B2 | 5/2008 | Campbell et al. | |
| 7,380,409 B2 | 6/2008 | Campbell et al. | |
| 7,450,385 B1 | 11/2008 | Campbell et al. | |
| 7,477,513 B1 | 1/2009 | Cader et al. | |
| 7,495,914 B2 | 2/2009 | Tilton et al. | |
| 7,509,828 B2 * | 3/2009 | Thors et al. | 72/96 |
| 7,522,422 B2 | 4/2009 | Chiba et al. | |
| 7,637,012 B2 * | 12/2009 | Thors et al. | 165/181 |
| 8,091,616 B2 * | 1/2012 | Lu et al. | 165/184 |
| 8,376,031 B2 * | 2/2013 | Yang et al. | 165/80.3 |
| 2001/0006101 A1 | 7/2001 | Chu et al. | |
| 2002/0062945 A1 | 5/2002 | Hocker et al. | |
| 2002/0118511 A1 | 8/2002 | Dujari et al. | |
| 2003/0205363 A1 | 11/2003 | Chu et al. | |
| 2004/0246683 A1 | 12/2004 | Honsberg-Riedl et al. | |
| 2006/0039111 A1 | 2/2006 | Huang | |
| 2006/0118280 A1 | 6/2006 | Liu | |
| 2006/0162365 A1 | 7/2006 | Hoang et al. | |
| 2006/0191675 A1 | 8/2006 | Fletcher et al. | |
| 2006/0196640 A1 | 9/2006 | Siu | |
| 2007/0133173 A1 | 6/2007 | Hsiung et al. | |
| 2007/0201210 A1 | 8/2007 | Chow et al. | |
| 2007/0258213 A1 | 11/2007 | Chen et al. | |
| 2008/0002363 A1 | 1/2008 | Campbell et al. | |
| 2008/0225478 A1 | 9/2008 | Goettert et al. | |
| 2009/0284918 A1 | 11/2009 | Chou | |
| 2009/0284927 A1 | 11/2009 | Li et al. | |
| 2010/0328882 A1 | 12/2010 | Campbell et al. | |
| 2010/0328889 A1 | 12/2010 | Campbell et al. | |
| 2010/0328890 A1 | 12/2010 | Campbell et al. | |
| 2010/0328891 A1 | 12/2010 | Campbell et al. | |

OTHER PUBLICATIONS

Notice of Allowance for U.S. Appl. No. 12/491,287 (U.S. Patent Publication No. 2010/0328890 A1), dated Feb. 16, 2011.

Iyengar et al., "Apparatus and Method for Facilitating Cooling of an Electronics System", U.S. Appl. No. 11/957,619, filed Dec. 17, 2007.

Chu et al., "Energy Efficient Apparatus and Method for Cooling and Electronics Rack", U.S. Appl. No. 12/108,020, filed Apr. 23, 2008.

Campbell et al., "Suspended Integrated Manifold System with Serviceability for Large Planar Arrays of Electronic Modules", IBM Technical Disclosure, IP.com, IP.com No. IPCOM000126455D (Jul. 18, 2005).

Chee, B., "Supermicro Water Cooled Blades", Info World, Geeks in Paradise, (Mar. 5, 2008), http://weblog.infoworld.com/geeks/archives/2008/03.

Campbell et al., "Liquid Cooling Apparatus and Method of Facilitating Cooling of an Electronic System", U.S. Appl. No. 12/168,259, filed Jul. 7, 2008.

Ellsworth, Jr., et al., "System and Method for Facilitating Cooling of a Liquid-Cooled Electronics Rack", U.S. Appl. No. 11/942,207, filed Nov. 19, 2007.

Campbell et al., "Hybrid Air and Liquid Coolant Conditioning Unit for Facilitating Cooling of One or More Electronics Racks of a Dada Center", U.S. Appl. No. 11/944,680, filed Nov. 26, 2007.

Campbell et al., "Method and Apparatus for Defect Detection in a Cold Plate", U.S. Appl. No. 12/053,762, filed Mar. 24, 2008.

Campbell et al., "Cooling Apparatus and Method of Fabrication Thereof with Jet Impingement Structure Integrally Formed on Thermally Conductive Pin Fins", U.S. Appl. No. 12/141,290, filed Jun. 18, 2008.

Campbell et al., "Cooling Apparatus and Method of Fabrication Thereof with a Cold Plate Formed In Situ on a Surface to be Cooled", U.S. Appl. No. 12/143,289, filed Jun. 20, 2008.

Campbell et al., "Apparatus and Method for Facilitating Pumped Immersion-Cooling of an Electronic Subsystem", U.S. Appl. No. 12/256,628, filed Oct. 23, 2008.

Office Action for U.S. Appl. No. 12/491,287, dated Nov. 30, 2010.

Office Action for U.S. Appl. No. 12/491,293 (U.S. Patent Publication No. 2010/0328891 A1), dated Mar. 13, 2011.

Office Action for U.S. Appl. No. 12/491,287, dated Aug. 19, 2010.

Notice of Allowance for U.S. Appl. No. 12/491,289, dated Aug. 27, 2010.

Office Action for U.S. Appl. No. 12/491,281, dated Oct. 7, 2010.

* cited by examiner

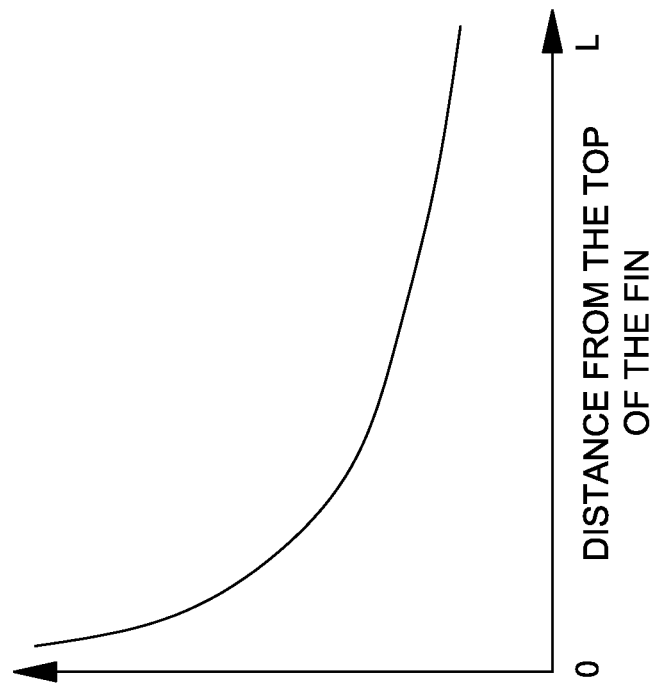
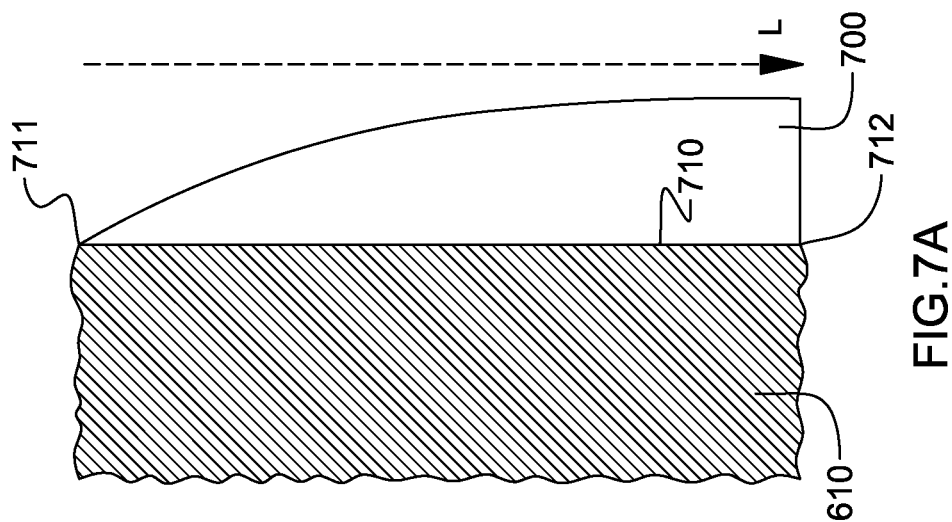
FIG. 7B
FIG. 7A

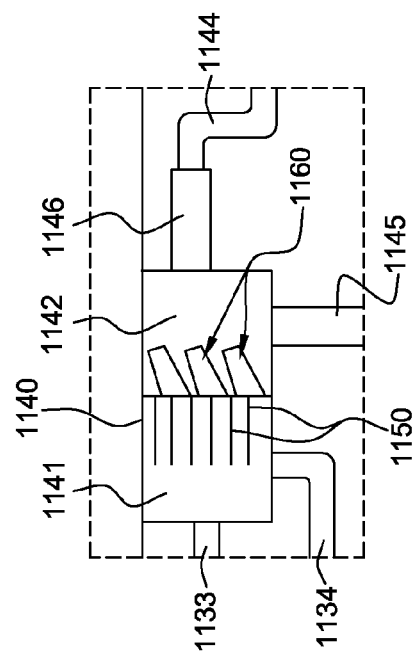
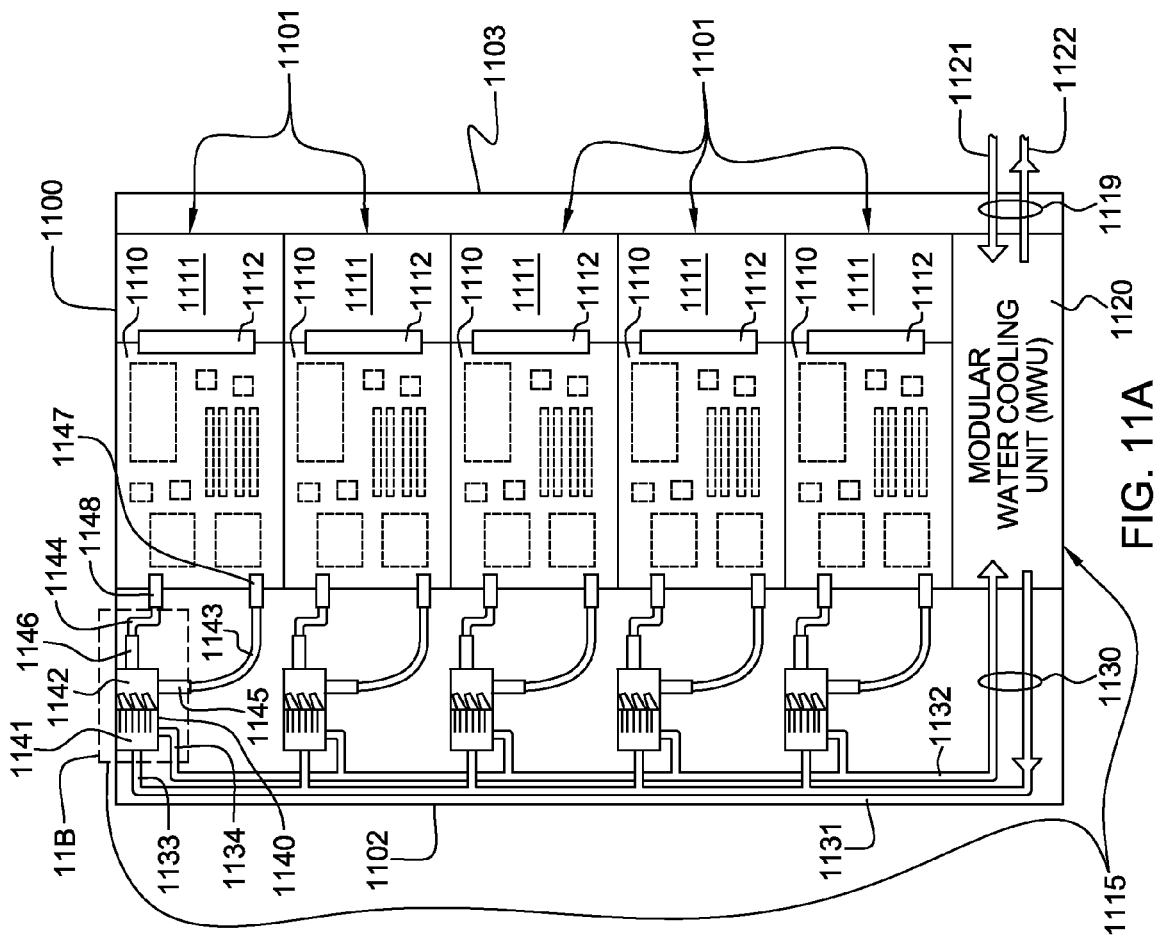
FIG. 11B
FIG. 11A

CONDENSER FIN STRUCTURES FACILITATING VAPOR CONDENSATION COOLING OF COOLANT

TECHNICAL FIELD

The present invention relates to heat transfer mechanisms, and more particularly, to cooling apparatuses, cooled electronic modules and methods of fabrication thereof for removing heat generated by one or more electronic devices. Still more particularly, the present invention relates to pin-fin structures configured with diverging cross-sections to enhance vapor condensation cooling of coolant employed in a cooling apparatus for cooling an electronic module, an electronic subsystem or electronics rack, such as for use in a cooled electronic module with pump-enhanced, dielectric fluid immersion-cooling of one or more heat-generating electronic devices.

BACKGROUND OF THE INVENTION

As is known, operating electronic devices produce heat. This heat should be removed from the devices in order to maintain device junction temperatures within desirable limits, with failure to remove heat effectively resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

The need to cool current and future high heat load, high heat flux electronic devices therefore mandates the development of aggressive thermal management techniques, using liquid cooling. Various types of liquid coolants provide different cooling capabilities. For example, fluids such as refrigerants or other dielectric liquids (e.g., fluorocarbon liquid) exhibit lower thermal conductivity and specific heat properties compared to liquids such as water or other aqueous fluids. Dielectric liquids have an advantage, however, in that they may be placed in direct physical contact with electronic devices and their interconnects without adverse affects, such as corrosion or electrical short circuits. Other cooling liquids, such as water or other aqueous fluids, exhibit superior thermal conductivity and specific heat compared with dielectric fluids. Water-based coolants, however, must be kept from physical contact with electronic devices and interconnects, since corrosion and electrical short circuit problems are otherwise likely to result.

SUMMARY OF THE INVENTION

In one aspect, the shortcomings of the prior art are overcome and additional advantages are provided through the provision of a vapor condenser. The vapor condenser includes a thermally conductive base structure and at least one thermally conductive condenser fin extending from the thermally conductive base structure. The thermally conductive base structure has an operational orientation when the vapor condenser facilitates vapor condensate formation. The at least one thermally conductive condenser fin has a varying transverse cross-sectional perimeter along at least a portion of its length L. The transverse cross-sectional perimeter of the at least one thermally conductive condenser fin is configured to increase in a direction of condensate travel along the at least a portion thereof when the thermally conductive base structure is in the operational orientation and the vapor condenser is facilitating vapor condensate formation.

In another aspect, a cooling apparatus is provided which includes a housing configured to at least partially surround and form a sealed compartment about an electronic device to be cooled, and dielectric fluid disposed within the sealed compartment, with the electronic device to be cooled at least partially immersed within the dielectric fluid. The cooling apparatus further includes a vapor condenser. The vapor condenser includes a thermally conductive base structure and a plurality of thermally conductive condenser fins extending from the thermally conductive base structure into the sealed compartment in an upper portion of the sealed compartment. The plurality of thermally conductive condenser fins facilitate cooling of dielectric fluid vapor rising to the upper portion of the sealed compartment. Further, at least one thermally conductive condenser fin of the plurality of thermally conductive condenser fins has a varying transverse cross-sectional perimeter along at least a portion of its length. The transverse cross-sectional perimeter of the at least one thermally conductive condenser fin increases in a direction of condensate travel along the at least a portion thereof, and the increasing transverse cross-sectional perimeter is pre-configured to reduce a thickness of dielectric fluid condensate film forming thereon when the vapor condenser is in use.

In yet another aspect, a cooling apparatus is provided which includes a heat exchanger comprising a compartment in fluid communication with a cooling loop and a vapor condenser disposed within the compartment to facilitate vapor condensate formation from vaporized coolant within the compartment. The vapor condenser includes a thermally conductive base structure having a vertical orientation, and a plurality of thermally conductive condenser fins extending from the thermally conductive base structure into the compartment. The plurality of thermally conductive condenser fins have a varying transverse cross-sectional perimeter along at least a portion of their length, and the transverse cross-sectional perimeters of the plurality of thermally conductive condenser fins increase in a direction of condensate travel as vapor condensate forms on the plurality of thermally conductive fins.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 7A is a partial illustration of condensation film thickness growth on a surface of a square-shaped pin-fin, such as depicted in FIGS. 6A-6C, in accordance with an aspect of the present invention;

FIG. 7B is a graph of the local condensation heat transfer coefficient between the solid surface and vapor versus distance L from the upper portion of the pin-fin structure illustrated in FIG. 7A, in accordance with an aspect of the present invention;

FIGS. 11A & 11B depict one embodiment of a liquid-cooled electronics rack utilizing the vapor condenser of FIG. 10B in a liquid-to-liquid heat exchanger, in accordance with an aspect of the present invention.

DETAILED DESCRIPTION OF THE INVENTION

Figure 1:
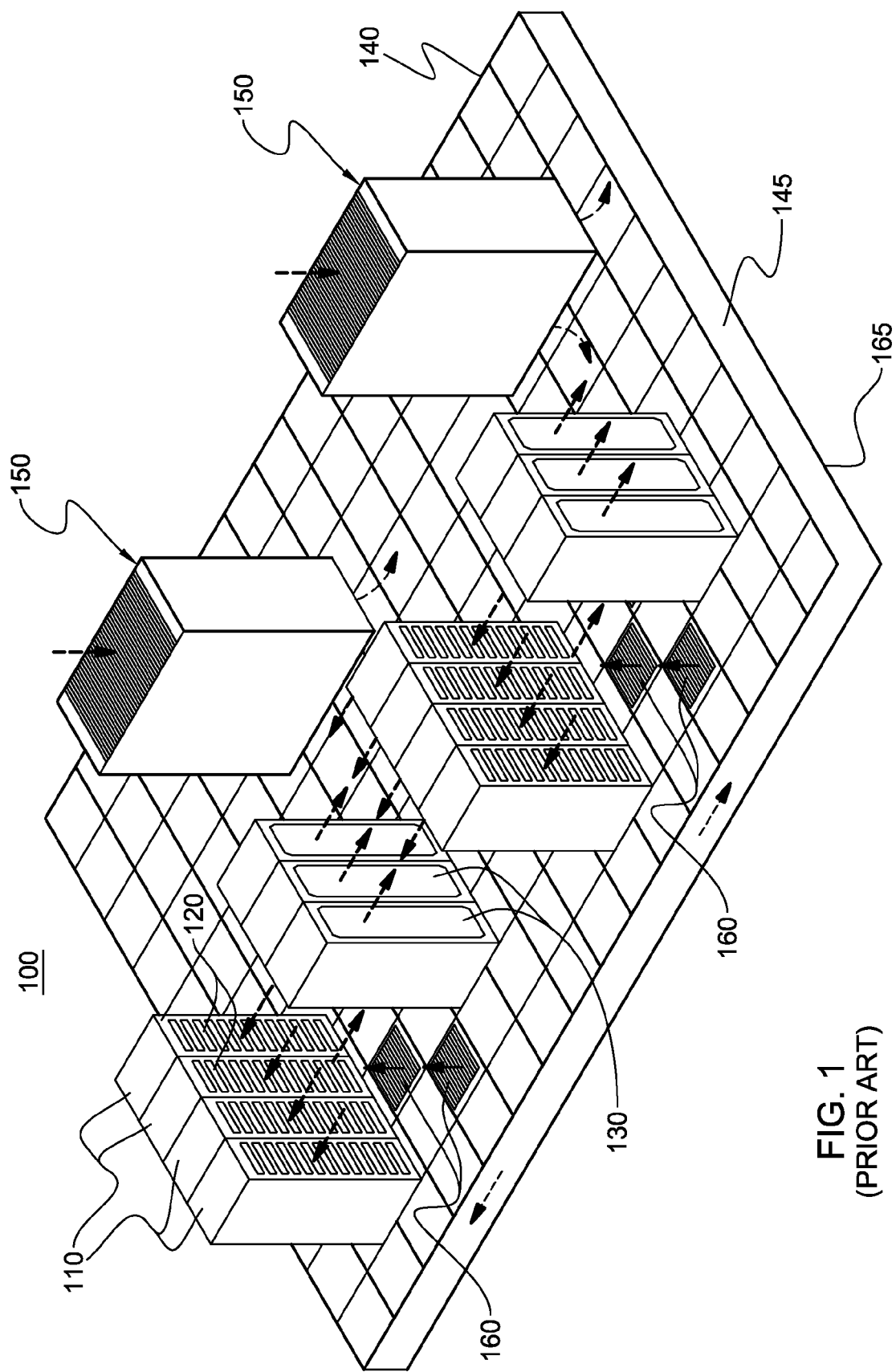
FIG. 1. depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system or electronic system, and may be, for example, a stand alone computer processor having high, mid or low end processing capability. In one embodiment, an electronics rack may comprise multiple electronic subsystems or drawers, each having one or more heat-generating components disposed therein requiring cooling. "Electronic subsystem" refers to any sub-housing, blade, book, drawer, node, compartment, etc., having one or more heat-generating electronic devices disposed therein. Each electronic subsystem of an electronics rack may be movable or fixed relative to the electronics rack, with the rack-mounted electronics drawers and blades of a blade center system being two examples of subsystems of an electronics rack to be cooled.

"Electronic device" refers to any heat-generating electronic device of, for example, a computer system or other electronics unit requiring cooling. By way of example, an electronic device may comprise one or more integrated circuit dies (or chips) and/or other electronic devices to be cooled, including one or more processor chips, memory chips and memory support chips. As a further example, the electronic device may comprise one or more bare dies or one or more packaged dies disposed on a common carrier. As used herein, "primary heat-generating component" refers to a primary heat-generating electronic device within an electronic subsystem, while "secondary heat-generating component" refers to an electronic device of the electronic subsystem generating less heat than the primary heat-generating component to be cooled. "Primary heat-generating die" refers, for example, to a primary heat-generating die or chip within a heat-generating electronic device comprising primary and secondary heat-generating dies (with a processor die being one example). "Secondary heat-generating die" refers to a die of a multi-die electronic device generating less heat than the primary heat-generating die thereof (with memory dies and memory support dies being examples of secondary dies to be cooled). As one example, a heat-generating electronic device could comprise multiple primary heat-generating bare dies and multiple secondary heat-generating dies on a common carrier. Further, the term "cold plate" refers to any thermally conductive structure having one or more channels or passageways formed therein for flowing of coolant therethrough. In addition, "metallurgically bonded" refers generally herein to two components being welded, brazed or soldered together by any means.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the cooling concepts disclosed herein are readily adapted to use with other types of coolant on the facility side and/or on the system side. For example, one or more of the coolants may comprise a brine, a fluorocarbon liquid, a hydrofluoroether liquid, a liquid metal, or other similar coolant, or refrigerant, while still maintaining the advantages and unique features of the present invention.

Reference is made below to the drawings, which are not drawn to scale to facilitate understanding thereof, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise in part exhausted air from the "hot" aisles of the computer installation defined, for example, by opposing air outlet sides 130 of the electronics racks 110.

Figure 2:
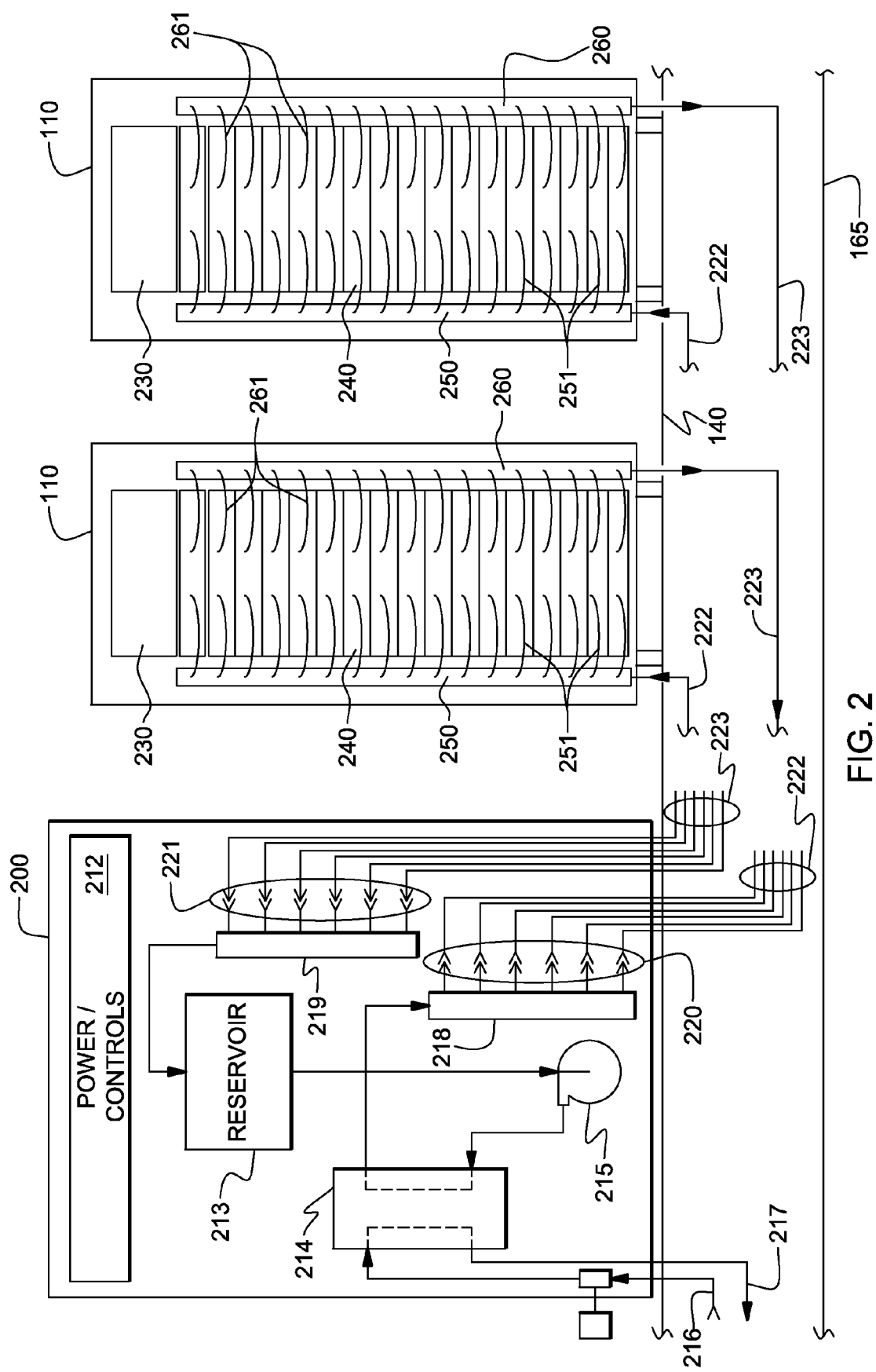
FIG. 2 depicts one embodiment of a coolant distribution unit for liquid-cooling of one or more electronics racks of a data center, in accordance with an aspect of the present invention.
Figure 3:
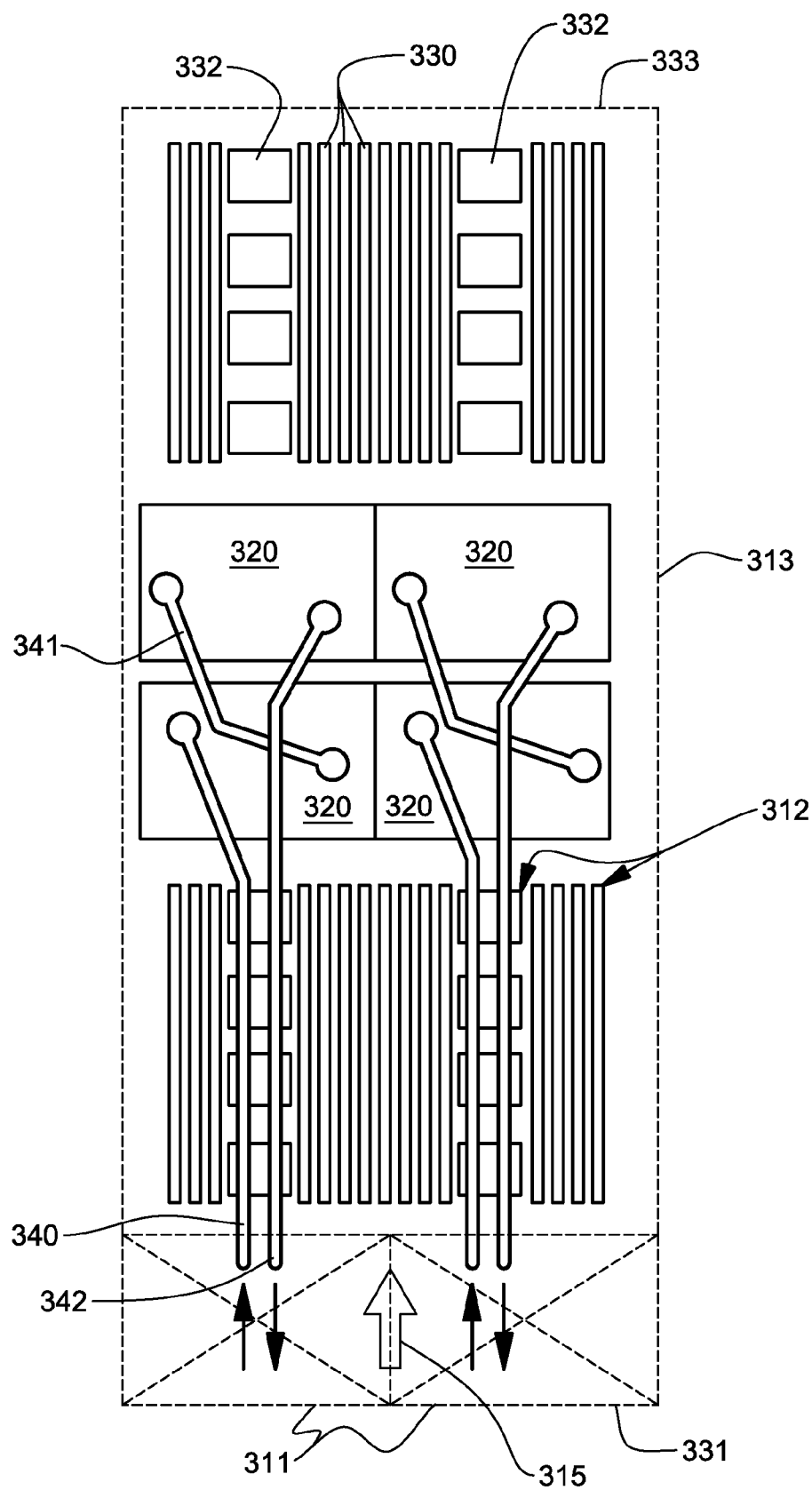
FIG. 3 is a plan view of one embodiment of an electronic subsystem layout illustrating an air and liquid cooling system for cooling components of the electronic subsystem, in accordance with an aspect of the present invention.
Figure 4:
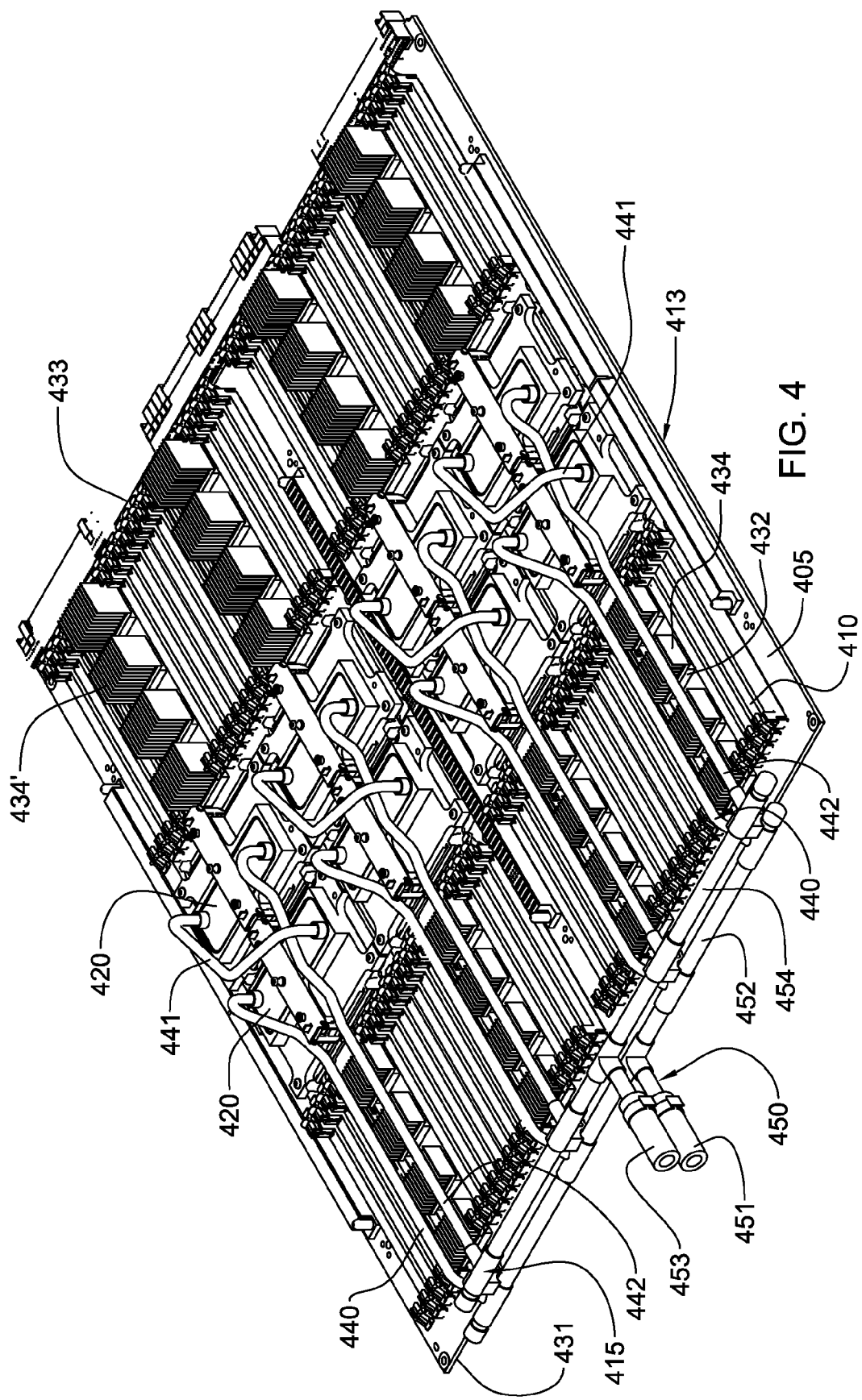
FIG. 4 depicts one detailed embodiment of a partially assembled electronic subsystem layout, wherein the electronic subsystem includes eight heat-generating electronic devices to be cooled, each having a respective cooling apparatus associated therewith, in accordance with an aspect of the present invention.

Due to the ever-increasing airflow requirements through electronics racks, and the limits of air distribution within the typical data center installation, liquid-based cooling is being combined with the conventional air-cooling. FIGS. 2-4 illustrate one embodiment of a data center implementation employing a liquid-based cooling system with one or more cold plates coupled to high heat-generating electronic devices disposed within the electronics racks.

FIG. 2 depicts one embodiment of a coolant distribution unit 200 for a data center. The coolant distribution unit is conventionally a large unit which occupies what would be considered a full electronics frame. Within coolant distribution unit 200 is a power/control element 212, a reservoir/expansion tank 213, a heat exchanger 214, a pump 215 (often accompanied by a redundant second pump), facility water inlet 216 and outlet 217 supply pipes, a supply manifold 218 supplying water or system coolant to the electronics racks 210 via couplings 220 and lines 222, and a return manifold 219 receiving water from the electronics racks 110, via lines 223 and couplings 221. Each electronics rack includes (in one example) a power/control unit 230 for the electronics rack, multiple electronic subsystems 240, a system coolant supply manifold 250, and a system coolant return manifold 260. As shown, each electronics rack 110 is disposed on raised floor 140 of the data center with lines 222 providing system coolant to system coolant supply manifolds 250 and lines 223 facilitating return of system coolant from system coolant return manifolds 260 being disposed in the supply air plenum beneath the raised floor.

In the embodiment illustrated, the system coolant supply manifold 250 provides system coolant to the cooling systems of the electronic subsystems (more particularly, to liquid-cooled cold plates thereof) via flexible hose connections 251, which are disposed between the supply manifold and the respective electronic subsystems within the rack. Similarly, system coolant return manifold 260 is coupled to the electronic subsystems via flexible hose connections 261. Quick connect couplings may be employed at the interface between flexible hoses 251, 261 and the individual electronic subsystems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronic subsystem 313 component layout wherein one or more air moving devices 311 provide forced air flow 315 to cool multiple components 312 within electronic subsystem 313. Cool air is taken in through a front 331 and exhausted out a back 333 of the subsystem. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronic subsystem 313, and partially arrayed near back 333 of electronic subsystem 313. Also, in the embodiment of FIG. 3, memory modules 330 and the memory support modules 332 are cooled by air flow 315 across the electronic subsystem.

The illustrated liquid-based cooling system further includes multiple coolant-carrying tubes connected to and in fluid communication with liquid-cooled cold plates 320. The coolant-carrying tubes comprise sets of coolant-carrying tubes, with each set including (for example) a coolant supply tube 340, a bridge tube 341 and a coolant return tube 342. In this example, each set of tubes provides liquid coolant to a series-connected pair of cold plates 320 (coupled to a pair of processor modules). Coolant flows into a first cold plate of each pair via the coolant supply tube 340 and from the first cold plate to a second cold plate of the pair via bridge tube or line 341, which may or may not be thermally conductive. From the second cold plate of the pair, coolant is returned through the respective coolant return tube 342.

FIG. 4 depicts in greater detail an alternate electronic subsystem layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is cooled and conditioned water.

FIG. 4 is an isometric view of one embodiment of an electronic subsystem or drawer, and monolithic cooling system. The depicted planar server assembly includes a multilayer printed circuit board to which memory DIMM sockets and various electronic devices to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to facilitate cooling one or more electronic devices to which the cold plates are mechanically and thermally coupled. The number of parallel paths and the number of series-connected liquid-cooled cold plates depends, for example, on the desired device temperature, available coolant temperature and coolant flow rate, and the total heat load being dissipated from each electronic device.

More particularly, FIG. 4 depicts a partially assembled electronic subsystem 413 and an assembled liquid-based cooling system 415 coupled to primary heat-generating components (e.g., including processor dies) to be cooled. In this embodiment, the electronics system is configured for (or as) an electronics drawer of an electronics rack, and includes, by way of example, a support substrate or planar board 405, a plurality of memory module sockets 410 (with the memory modules (e.g., dual in-line memory modules) not shown), multiple rows of memory support modules 432 (each having coupled thereto an air-cooled heat sink 434), and multiple processor modules (not shown) disposed below the liquid-cooled cold plates 420 of the liquid-based cooling system 415.

In addition to liquid-cooled cold plates 420, liquid-based cooling system 415 includes multiple coolant-carrying tubes, including coolant supply tubes 440 and coolant return tubes 442 in fluid communication with respective liquid-cooled cold plates 420. The coolant-carrying tubes 440, 442 are also connected to a header (or manifold) subassembly 450 which facilitates distribution of liquid coolant to the coolant supply tubes and return of liquid coolant from the coolant return tubes 442. In this embodiment, the air-cooled heat sinks 434 coupled to memory support modules 432 closer to front 431 of electronic subsystem 413 are shorter in height than the air-cooled heat sinks 434' coupled to memory support modules 432 near back 433 of electronic subsystem 413. This size difference is to accommodate the coolant-carrying tubes 440, 442 since, in this embodiment, the header subassembly 450 is at the front 431 of the electronics drawer and the multiple liquid-cooled cold plates 420 are in the middle of the drawer.

Liquid-based cooling system 415 comprises a pre-configured monolithic structure which includes multiple (pre-assembled) liquid-cooled cold plates 420 configured and disposed in spaced relation to engage respective heat-generating electronic devices. Each liquid-cooled cold plate 420 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 420 to the associated electronic device to form the cold plate and electronic device assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 4, header subassembly 450 includes two liquid manifolds, i.e., a coolant supply header 452 and a coolant return header 454, which in one embodiment, are coupled together via supporting brackets. In the monolithic cooling structure of FIG. 4, the coolant supply header 452 is metallurgically bonded in fluid communication to each coolant supply tube 440, while the coolant return header 454 is metallurgically bonded in fluid communication to each coolant return tube 452. A single coolant inlet 451 and a single coolant outlet 453 extend from the header subassembly for coupling to the electronics rack's coolant supply and return manifolds (not shown).

FIG. 4 also depicts one embodiment of the pre-configured, coolant-carrying tubes. In addition to coolant supply tubes 440 and coolant return tubes 442, bridge tubes or lines 441 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 440, bridge tubes 441 and coolant return tubes 442 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

Figure 5:
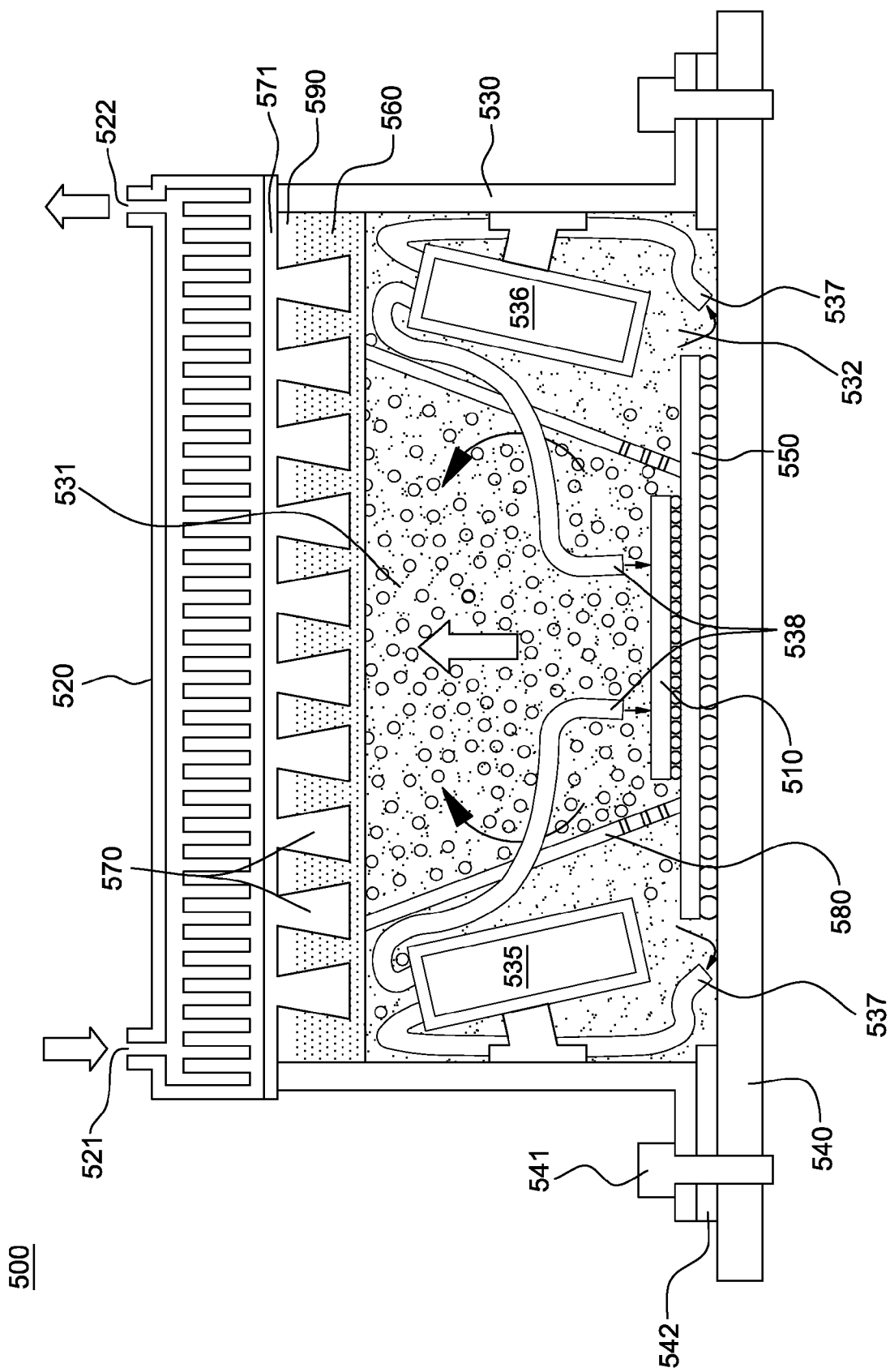
FIG. 5 is a cross-sectional elevational view of one embodiment of a cooled electronic module, in accordance with an aspect of the present invention.

FIG. 5 depicts one embodiment of a pump-enhanced, immersion cooled electronic module 500, which is a structural and thermal interface between a heat-generating electronic device 510, such as a processor or other integrated circuit die, and a liquid-cooled cold plate 520, such as the above-described liquid-cooled cold plate 420 of the electronic subsystem of FIG. 4. Cooled electronic module 500 includes a module casing 530 which forms part of a housing, configured to at least partially surround and form a sealed, fluid-tight compartment 531 about electronic device 510 to be cooled. As shown, dielectric coolant 532 is disposed within sealed compartment 531, as are two impingement-cooling, immersed pumps 535, 536. Each impingement-cooling, immersed pump 535, 536 includes an inlet pump tube 537 disposed with an inlet in a lower portion of the sealed compartment for drawing liquid dielectric fluid into the pump, and a respective pump jet nozzle 538 for directing pressurized dielectric fluid towards the electronic device to be cooled to facilitate the cooling thereof. By way of specific example, the impingement-cooling, immersed pumps may each be an LPD-125 liquid pump offered by AdaptivEnergy, LLC, of Hampton, Va., USA.

The housing is a shell-like component that is attached to, for example, a printed circuit board 540 using bolts or screws 541 and a sealing gasket (or o-ring) 542, which is compressed between a lower surface of the housing and an upper surface of the board, or alternatively, between a lower surface of the housing and an upper surface of a substrate 550 to which the electronic device 510 directly couples. As shown, multiple electrical connections, such as controlled collapse chip connections (C4) connections, electrically couple the electronic device to substrate 550, which in this embodiment is itself electrically coupled via another set of electrical connections to printed circuit board 540.

As used herein, the word "substrate" refers to any underlying supporting structure, such as substrate 550 or printed circuit board 540 to which the electronic device is coupled, and to which the housing may be sealed in order to form sealed compartment 531 about the electronic device. Sealing gasket 542 seals off the inner compartment of the housing and assists in retaining the dielectric fluid within the sealed compartment. The two impingement-cooling, immersed pumps 535, 536 are, in this embodiment, mechanically coupled to opposing side walls of the housing, and are positioned, sized and configured to force pressurized dielectric coolant towards the heat-generating electronic device to be cooled, such as a back surface of the heat-generating electronic device. This is accomplished (in one embodiment) via dual, freestanding jet nozzles 538 positioned directly over the back surface of the electronic device to be cooled. When in operation, as dielectric fluid absorbs heat, it boils undergoing a phase change from liquid phase to vapor phase, and thus its latent heat of vaporization is utilized for cooling purposes. The resultant dielectric fluid vapor rises to the upper portion of the sealed compartment and forms a dielectric vapor layer 560 in the upper portion of the sealed compartment. Vapor rises since it possesses a significantly lower density compared with the surrounding dielectric liquid. A submerged baffle (or vapor barrier) 580 facilitates directing dielectric fluid vapor upwards to the upper portion of the sealed compartment. At the upper most portion of the sealed compartment, there is illustrated a thin, non-condensable gas layer 590 comprising gases, such as air, which have also left the liquid and travel upwards. These gases can reside in solution within the dielectric fluid, but once out-gassed through the boiling process, cannot be returned to solution via a coolant condensation process.

As depicted, cooled electronic module 500 further comprises a plurality of thermally conductive condenser fins 570 extending into the sealed compartment from a top wall 571 (i.e., base structure) of the housing. In one embodiment, these condenser fins are appropriately sized to accommodate the anticipated dielectric vapor layer 560 to form in the upper portion of the sealed compartment with operation of the heat-generating electronic device. Upon reaching the upper portion of the sealed compartment, the dielectric fluid vapor contacts the cool surfaces of the condenser fins, which are cooled, for example, by means of a thermal conduction coupling to liquid-cooled cold plate 520, and more particularly, to system coolant passing via inlet 521 and outlet 522 through the liquid-cooled cold plate. By making contact with the cool, vertically-oriented condenser fin surfaces, the dielectric fluid vapor undergoes a second phase change process condensing from vapor to liquid state, and the liquid droplets fall back downward due to gravity and their relatively higher density compared with the neighboring vapor region. By way of example, the vertically-oriented condenser fins might comprise pin fin or plate fin structures. In the embodiment illustrated in FIG. 5, the transverse cross-sectional perimeters of condenser fins 570 vary in the direction of condensate flow to define the illustrated diverging fin structures. This configuration provides numerous advantages. For example, an increased condensation heat transfer area is provided by the diverging condenser fins. Additionally, as explained further below, the diverging condenser fin structures function to reduce the thickness of the liquid condensate film which would otherwise form thereon in the direction of condensate travel along the outer surfaces of the fins, which increases the local condensation heat transfer coefficient between the solid surface and the vapor being condensed. These aspects of the diverging fin structure are described further below with reference to FIGS. 6A-11B.

Continuing with FIG. 5, dielectric liquid in the lower portion of the sealed compartment is simultaneously being drawn into the low pressure side of the immersed pumps 535, 536 via the inlet pump tubing 537. Note that the submerged baffle is configured to function to partially isolate the vapor rich region near the electronic device from the liquid (condensate) rich region near the pump inlet tube openings. The baffle 580 may include openings in its lower portion to allow the dielectric fluid to find its own common level within the sealed compartment. As long as the boiling and condensation cooling processes are in equilibrium and are commensurate with heat generated by the electronic device to be cooled, the electronic module will successfully transport heat from the electronic device to the cold plate, maintaining steady state temperatures throughout.

The coolant employed within the dielectric module is a dielectric fluid so as not to cause a short circuit of electrical current on the various exposed parts of the electronic device and substrate. Many dielectric fluids are commercially available and may be used in the cooled electronic module configuration described herein. Examples include the Novec fluids, manufactured by 3M Corporation (e.g., FC-72, FC-86, HFE-7000 and HFE-7200). Those skilled in the art should note that in addition to the cooling taking place from the electronic device due to the impinging dielectric fluid, there is also heat transfer occurring from the substrate and any other component within the enclosure which generates heat. It should also be noted that the cooled electronic module embodiment of FIG. 5 employs two immersed pumps for redundancy, in the event of a single pump failure. Other configurations may employ only one pump, or even more than two pumps if desired.

Further details and variations of a pump-enhanced, immersion-cooled electronic module such as depicted in FIG. 5 are disclosed in co-filed U.S. patent application Ser. No. 12/491,281, entitled "Cooled Electronic Module with Pump-Enhanced, Dielectric Fluid-Immersion Cooling", and co-filed U.S. patent application Ser. No. 12/491,287, entitled "Condenser Structures with Fin Cavities Facilitating Vapor Condensation Cooling of Coolant", and co-filed U.S. patent application Ser. No. 12/491,298, entitled "Direct Jet Impingement-Assisted Thermosyphon Cooling Apparatus and Method", and U.S. patent application Ser. No. 12,491,293, entitled "Condenser Block Structures with Cavities Facilitating Vapor Condensation Cooling of Coolant", the entirety of each of which is hereby incorporated herein by reference.

Figure 6B:
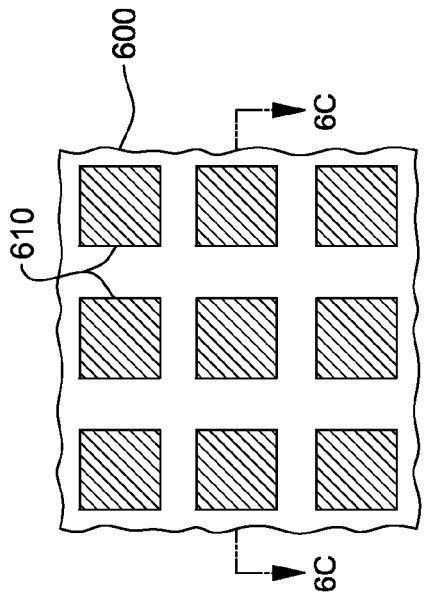
FIG. 6B is a cross-sectional plan view of the vapor condenser structure of FIG. 6A, taken along line 6B-6B of FIG. 6C, in accordance with an aspect of the present invention.
Figure 6C:
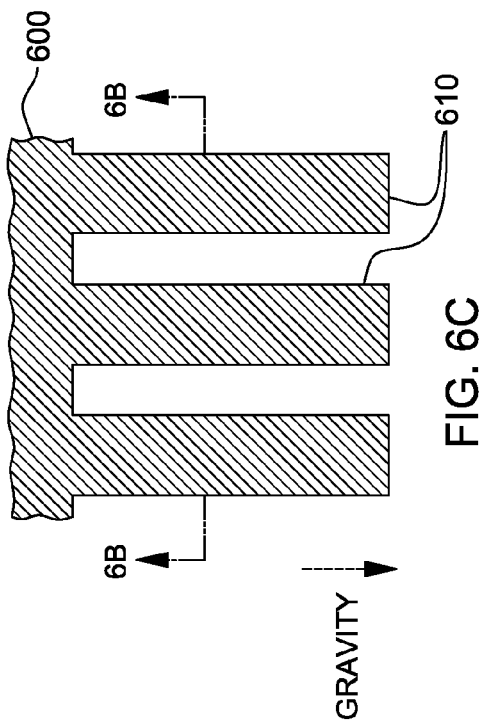
FIG. 6C is a cross-sectional elevational view of the vapor condenser structure of FIG. 6A, taken along line 6C-6C of FIG. 6B, in accordance with an aspect of the present invention.
Figure 6A:
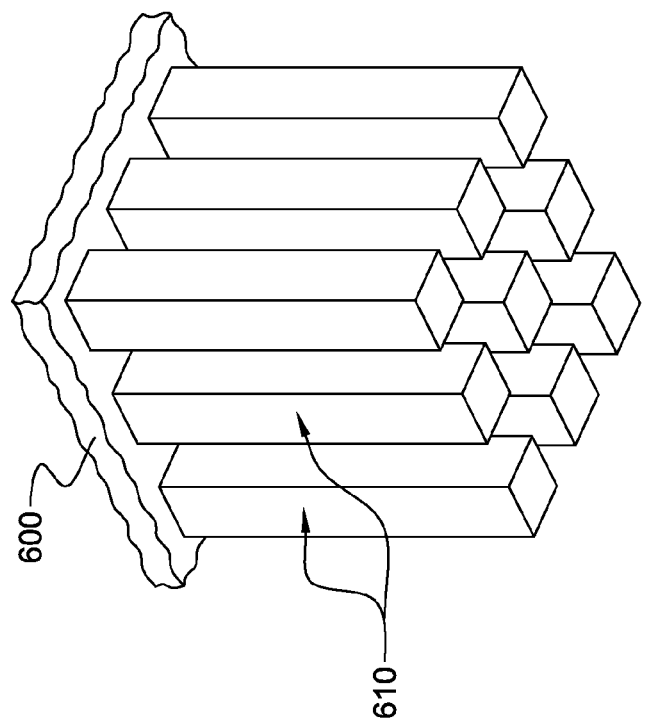
FIG. 6A is a partial depiction of a one embodiment of a vapor condenser structure, in accordance with an aspect of the present invention.

FIG. 6A is a partial depiction of a vapor condenser employable, for example, in an immersion-cooled electronic module such as described above. In this configuration, the vapor condenser comprises a base structure 600, such as a top wall in the pump-enhanced, immersion-cooled electronic module of FIG. 5, and a plurality of thermally conductive condenser fins 610 extending downward from the base structure. As illustrated in FIG. 6B, in this example, the plurality of condenser fins are each square-shaped pin-fins having a uniform transverse cross-sectional perimeter along their lengths from the proximal ends thereof adjacent to the base structure to their remote ends. As illustrated, the vertically-oriented, condenser pin-fins of uniform transverse cross-section along their length have four vertical, flat surfaces on which vapor condenses and travels downward in the direction of gravity.

In FIG. 7A, a portion of a condenser pin-fin 610 is shown with a condensate liquid film 700 growing as vapor contacting the cool fin wall 710 condenses into liquid state and flows downward on surface 710 of condenser pin 610 (in the direction of gravity) from an upper portion 711 to a lower portion 712 thereof. As illustrated, as the liquid flows downwards, it grows in thickness along the length L of the condenser fin. The vapor in this region is thus condensed by conduction cooling that takes place through the liquid film. As the liquid film grows thicker, the condensation heat transfer coefficient drops significantly, resulting in a reduced heat transfer rate from the fin surfaces that are further away from the upper portion of the fin, that is, the portion of the fin closest to the base structure in this example. This reduced effective condensation heat transfer coefficient along the fin length for condenser fins such as depicted in FIGS. 6A-6C, is illustrated in the graph of FIG. 7B, wherein the local condensation heat transfer coefficient between the solid surface of the condenser fin and the vapor undergoing condensation is plotted against the distance from the upper portion of the vertically-oriented condenser fin along its length L. As illustrated, the local condensation heat transfer coefficient is a function of the heat conduction through the liquid film, meaning that the coefficient decreases as the thickness of the liquid condensate film increases on the cold surface of the condenser fin. In this vertically-oriented condenser fin example, the coefficient is shown to drop along the length of the condenser fin from the base structure.

FIGS. 8A-10B depict various vapor condensers configured to address this phenomenon.

Figure 8B:
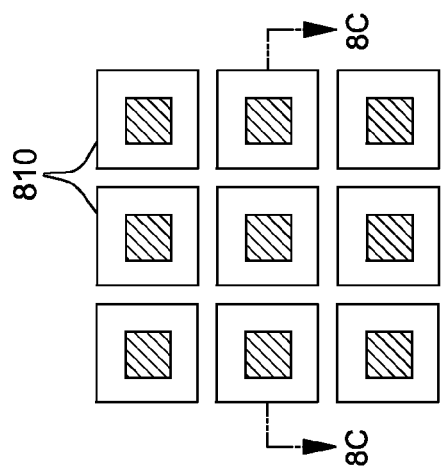
FIG. 8B is a cross-sectional plan view of the vapor condenser of FIG. 8A, taken along line 8B-8B of FIG. 8C, in accordance with an aspect of the present invention.
Figure 8C:
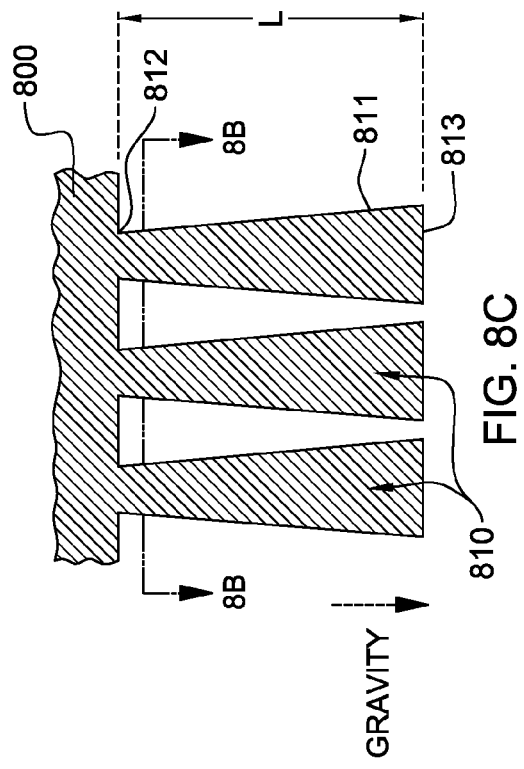
FIG. 8C is a cross-sectional elevational view of the vapor condenser of FIGS. 8A & 8B, taken along line 8C-8C of FIG. 8B, in accordance with an aspect of the present invention.
Figure 8A:
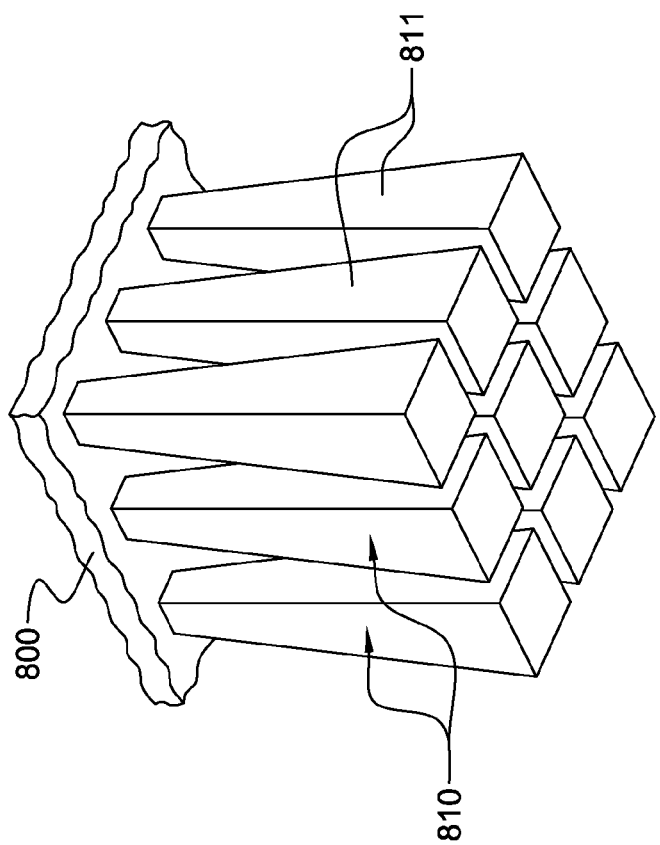
FIG. 8A partially depicts an alternate embodiment of a vapor condenser with diverging pin-fins of non-uniform cross-section, in accordance with an aspect of the present invention.

FIGS. 8A-8C are a partial depiction of a vapor condenser comprising a base structure 800 and a plurality of condenser fins 810 depending therefrom. In this example, the base structure and the plurality of condenser fins are each thermally conductive, and the plurality of condenser fins are a plurality of pin-fins. Further, the base structure has a horizontal operational orientation when the vapor condenser is in use, as illustrated in FIG. 8C. As shown, the condenser pin-fins are rectangular-shaped or square-shaped, each with diverging outer surfaces 811 from a proximal end 812 adjacent to base structure 800 to a remote end 813 remote from the base structure. The plurality of condenser pin-fins, in this example, extend a common length L from base structure 800. Because the outer surfaces of each condenser pin-fin diverge, the condenser pin-fins have an increasing surface area along their length L from the proximal end 812 to the remote end 813 thereof. Stated broadly, the transverse cross-sectional perimeters of the condenser fins vary along at least a portion of their length L, that is, the transverse cross-sectional perimeter of the condenser fins increases in the direction of condensate travel when the vapor condenser is facilitating vapor condensate formation. Advantageously, as liquid condensate flows downwards, it flows along a condenser pin-fin surface which increases in area. This increase in pin-fin surface area is configured to compensate for the increased volume of liquid condensate in the regions that are further from the base structure. Thus, even though the volume of condensed liquid increases in the downward direction, the film thickness remains relatively thin. Since, as explained above in connection with FIGS. 7A & 7B, the condensation heat transfer coefficient is highly dependent on this liquid condensate film thickness, a thinner liquid film yields a significantly larger heat transfer coefficient, and hence, for the diverging condenser pin-fins shown in FIGS. 8A-8C, the condensation heat transfer coefficient along the length of the condenser pin-fin remains relatively large and results in higher heat transfer rates than would be achievable using the condenser pin-fin design of FIGS. 6A-6C.

The fin geometry shown in FIGS. 8A-8C can be manufactured via an electrical discharge machining (EDM) process, or via a bonding process wherein the condenser pin-fins are joined to a base structure or plate using soldering, brazing, welding, or gluing (e.g., with an epoxy). Alternatively, diverging condenser plate fins could be bonded to the base structure, and then cross-cut using a metal removal process, yielding pin-fins that diverge only along two surfaces or faces. In such a configuration, although having a varying cross-sectional perimeter, the surfaces of each condenser fin vary non-uniformly.

Figure 9:
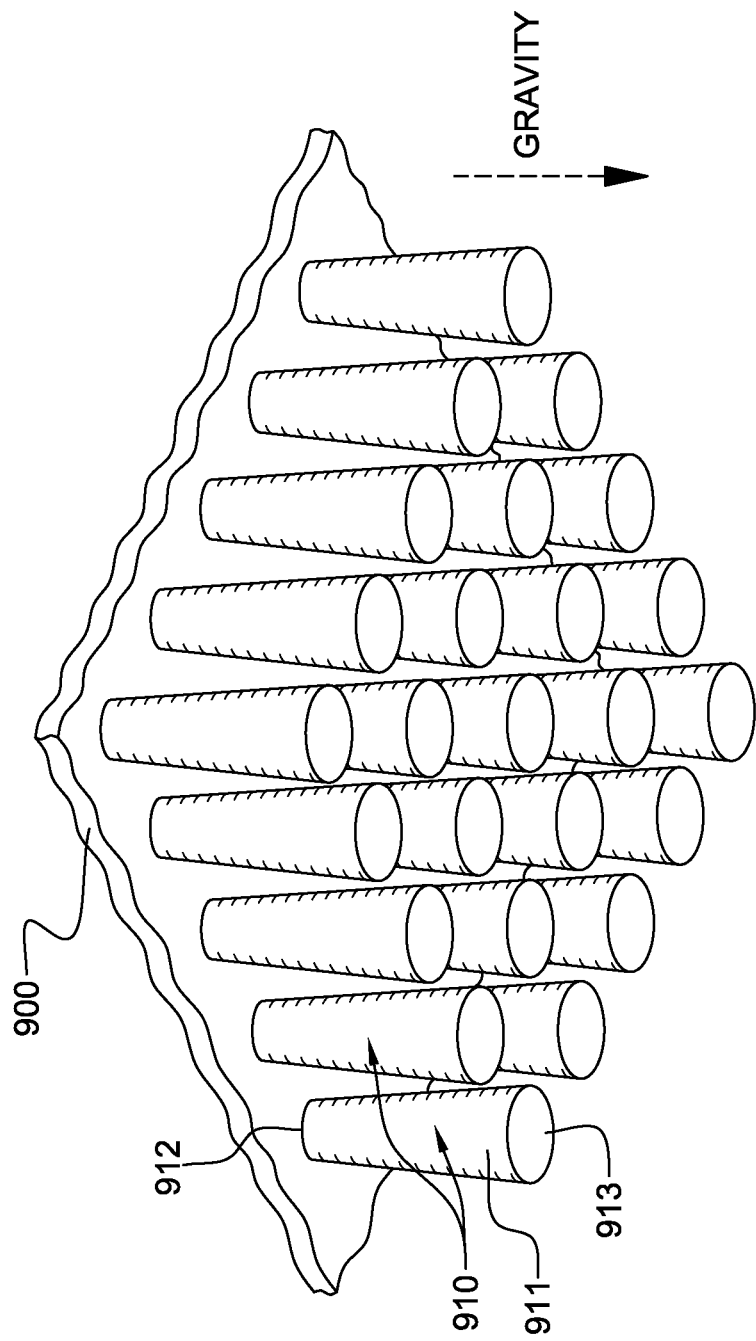
FIG. 9 is a partial isometric view of another embodiment of a vapor condenser with diverging, cylindrical-shaped pin-fins of non-uniform cross-section, in accordance with an aspect of the present invention.

FIG. 9 is an alternate embodiment of a vapor condenser, in accordance with an aspect of the present invention. In this embodiment, a base structure 900 has a plurality of condenser pin-fins 910 extending from a surface thereof. These condenser pin-fins 910 are a plurality of thermally conductive condenser fins, each of which diverges from a proximal end 912 adjacent to base structure 900 to a remote end 913 remote from the base structure, in the direction of gravity. The result is a condenser surface 911 which increases in surface area from the proximal end 912 to the distal end 913, with the condenser fins having a varying transverse cross-sectional perimeters, which increase along the length of the condenser pin-fins in a direction of condensate travel from the base structure (as in the example described above in connection with FIGS. 8A-8C). The difference in this embodiment is that the transverse cross-section of the condenser fins is circular-shaped, rather than rectangular-shaped or square-shaped, as illustrated in the example of FIGS. 8A-8C. Such a cylindrical-shaped condenser pin-fin geometry could be manufactured by, for example, a bonding process wherein the condenser pin-fins are joined to the base structure, such as a base plate, using soldering, brazing, welding, or gluing (e.g., with an epoxy).

Figure 10B:
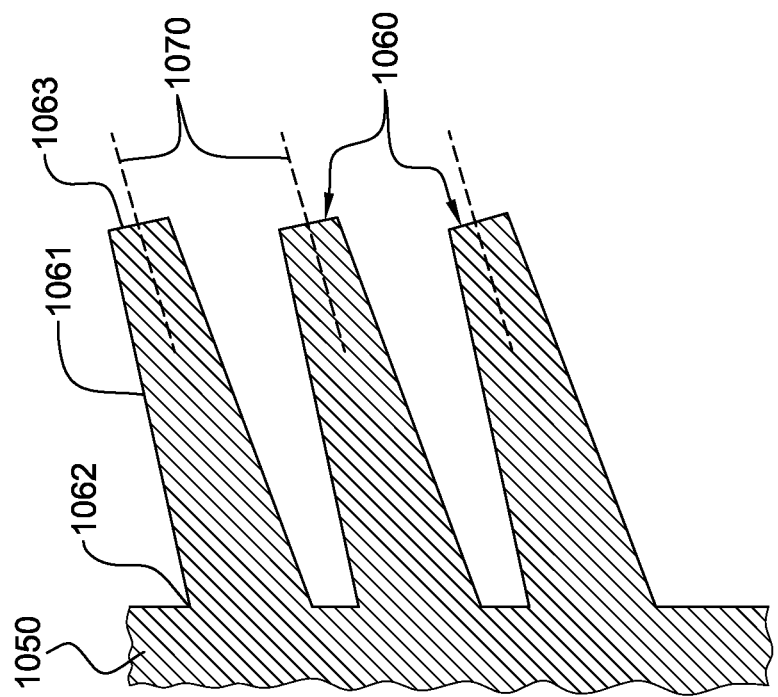
FIGS. 10A & 10B partially depict further alternate embodiments of a vapor condenser, in accordance with an aspect of the present invention.
Figure 10A:
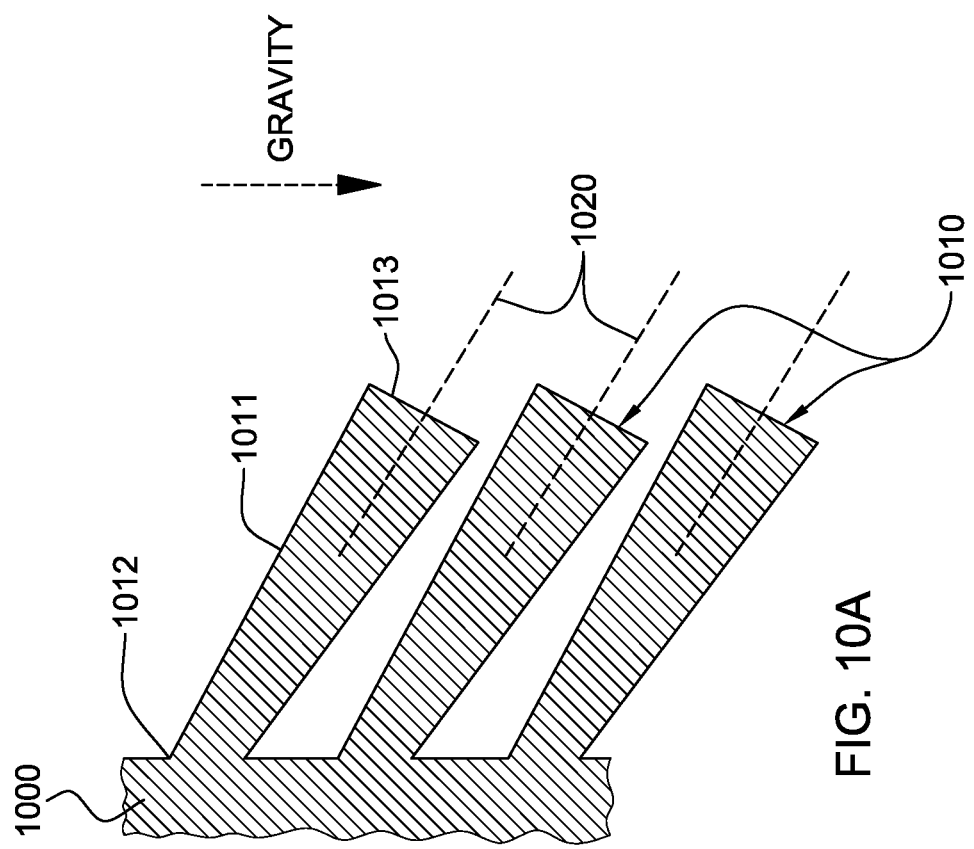

FIGS. 10A & 10B depict further embodiments of a vapor condenser, in accordance with aspects of the present invention. These vapor condenser configurations could be employed, for example, inside a remote vapor condenser structure, wherein the operational orientation of the base structure is vertical. An example of such a remote condenser is depicted in FIGS. 11A & 11B, and described further below.

Referring first to FIG. 10A, the illustrated vapor condenser embodiment includes a vertically-oriented, thermally conductive base structure 1000 having a plurality of thermally conductive condenser pin-fins 1010 extending therefrom at a downward angle such that the center lines 1020 of the plurality of condenser fins have a component parallel with the direction of gravity, meaning that the direction of condensate travel in this example is away from base structure 1000. The downward-sloping, diverging condenser fins 1010 each have a varying transverse cross-sectional perimeter along their length from a proximal end 1012 adjacent to base structure 1000 to a remote end 1013, which results in a condensing surface 1011 that increases in surface area transverse to the center line 1020 in a direction which liquid condensate travels when the vapor condenser is operationally employed as illustrated.

In FIG. 10B, a thermally conductive base structure 1050 is shown having a vertical orientation and a plurality of thermally conductive condenser fins 1060 extending from a surface thereof. In this example, the plurality of thermally conductive condenser pin-fins 1060 have a center line 1070 which extends upwards from the vertically-oriented base structure 1050. Thus, liquid condensate flows in a direction of travel towards the base structure. In order to enhance the condensation heat transfer coefficient, therefore, the cross-sectional surface area of the condenser fins increases from a remote end 1063 to a proximal end 1062, adjacent to thermally conductive base structure 1050. The thermally conductive condenser fin surfaces 1061 thus increase in surface area from the remote end 1063 to proximal end 1062 thereof.

FIGS. 11A & 11B depict one example of a cooled electronics rack which employs a liquid-to-liquid heat exchanger utilizing a vapor condenser such as illustrated in FIGS. 10A & 10B.

In the embodiment illustrated in FIGS. 11A & 11B, the vapor condenser of FIG. 10B is utilized (by way of example only). As illustrated, the cooled electronics rack includes an electronics rack 1100 having a plurality of multi-blade center systems 1101 stacked within the rack. In this example, five multi-blade center systems 1101 are illustrated, with each system being an example of an electronic system chassis. As illustrated in FIG. 11A, each multi-blade center system 1101 includes a back plane 1112, into which respective removable immersion-cooled blades 1110 are electrically, operatively inserted, and a back space 1111 which conventionally would accommodate one or more air-moving devices (not shown) to cause airflow to flow from a front side 1102 to a back side 1103 of electronics rack 1100 through the multi-blade center systems 1101.

One embodiment of a liquid cooling apparatus, generally denoted 1115, is illustrated in FIG. 11A. In this embodiment, a rack-mounted, coolant conditioning unit (that is, modular water cooling unit 1120) is disposed in a lower portion of electronics rack 1100. Modular water cooling unit 1120 includes, in one example, a pump, a reservoir, and a heat exchanger coupled in series fluid communication, as illustrated in FIG. 11A. In this example, the heat exchanger may be a liquid-to-liquid heat exchanger which extracts heat from coolant flowing through a first coolant loop 1130 of liquid cooling apparatus 1115 and dissipates the heat to a facility coolant loop 1119 comprising a facility coolant supply line 1121 and facility coolant return line 1122. In one example, facility coolant supply line 1121 and facility coolant return line 1122 couple modular water cooling unit 1120 to a data center facility coolant supply and return (not shown). Modular water cooling unit 1120 may further include an optional filter in fluid communication with first coolant loop 1130.

In one embodiment, first coolant loop 1130 includes a rack-level inlet manifold 1131 and a rack-level outlet manifold 1132, which are coupled to coolant conditioning unit 1120 via, for example, flexible hoses and respective quick connect couplings. The flexible hoses allow the rack-level manifolds to be mounted within, for example, a door of the electronics rack which is hingedly mounted to the air inlet side of the rack in a manner similar to that described in co-pending, commonly assigned U.S. patent application Ser. No. 11/763,678, filed Jun. 15, 2007, entitled "Liquid-Based Cooling Apparatus for an Electronics Rack", the entirety of which is hereby incorporated herein by reference. In one example, rack-level inlet manifold 1131 and rack-level outlet manifold 1132 each comprise an elongated, rigid tube vertically mounted to electronics rack 1100.

In the embodiment illustrated, the rack-level coolant manifold assembly, comprising rack-level inlet manifold 1131 and rack-level outlet manifold 1132, is in fluid communication with multiple movable chassis-level manifold assemblies 1140. Various examples of movable chassis-level manifold assemblies mounted to an electronics rack are described in co-pending U.S. patent application Ser. No. 12/168,259, entitled "Liquid Cooling Apparatus and Method for Facilitating Cooling of an Electronics System", the entirety of which is hereby incorporated herein by reference. Respective quick connect couplings may be employed to couple the rack-level inlet manifold and rack-level outlet manifold to each movable chassis-level manifold assembly 1140, using for example appropriately sized, flexible rack-level tubing 1133, 1134. The quick connect couplings may be any one of various types of commercially available couplings, such as those available from Colder Products Company, of St. Paul, Minn., USA, or Parker Hannifin, of Cleveland, Ohio, USA.

Each movable chassis-level manifold assembly 1140 includes a first chamber 1141 and a second chamber 1142 disposed, in one example, within a common structure, but isolated to prevent direct flow of coolant therebetween. As explained further below, the first chamber and the plurality of second chambers are isolated by a heat exchanger which facilitates transfer of heat from coolant flowing through a plurality of second coolant paths passing through the plurality of second chambers to coolant flowing through a first coolant path passing through the first chamber. Heat transfer to coolant passing through the first coolant path of each chassis-level manifold assembly is transferred via the rack-level outlet manifold 1132 and modular water cooling unit 1120 to facility coolant loop 1119. In one example, coolant passing through first coolant loop 1130, and hence, coolant passing through the first coolant paths within the movable chassis-level manifold assemblies, is water. In the example illustrated, the vertically-oriented rack-level inlet and outlet manifolds each have five ports, which connect to five horizontally-oriented, movable chassis-level manifold assemblies 1140. The chassis-level manifold assemblies serve as a heat rejection component for the heat load removed from the individual blades 1110 of the respective multi-blade center systems 1101.

Specifically, each second chamber 1142 of the plurality of second chambers of each chassis-level manifold assembly 1140 has an outlet coupled via flexible tubing 1143 to a coolant inlet of a respective immersion-cooled blade 1110. In one embodiment, each flexible tubing 1143 couples to a respective second chamber of the chassis-level manifold assembly 1140 via an appropriate hose barb fitting 1145, and couples to the immersion-cooled blade 1110 via a quick connect coupling 1147. Further, flexible tubing 1144 couples an inlet of each second chamber of the plurality of second chambers of each chassis-level manifold assembly 1140 to a coolant outlet of the respective immersion-cooled blade 1110. At the outlet, a quick connect coupling 1148 is employed (in one embodiment) to facilitate connection or disconnection of the corresponding immersion-cooled blade, while at the other end, flexible tubing 1144 couples to chassis-level manifold assembly 1140 via an appropriate hose barb fitting 1146. Flexible tubes 1143, 1144 are sized and provided with sufficient flexibility to allow the associated movable chassis-level manifold assembly 1140 to reciprocate within a designed extent of travel.

As noted, in one example, a two-phase dielectric coolant is employed within immersion-cooled blade 1110 and the second chambers of the respective chassis-level manifold assemblies 1140. In operation, flexible tubing 1144 transports vaporized coolant from the respective immersion-cooled blade 1110 to the corresponding second chamber 1142 of the respective chassis-level manifold assembly. The second chamber functions as a condenser, with the lower flexible tubing 1143 transporting condensed liquid coolant from the second chamber to the immersion-cooled blade 1110 for continued cooling of the immersion-cooled blade.

One or more surfaces of electronic components within the blade may be exposed directly (or indirectly) to the surrounding dielectric coolant, and heat transfer takes place via, for example, boiling at one or more surfaces of the different electronic components. In one embodiment, the liquid coolant, and resultant vapor, are directed via one or more centrally extending baffles to an upper portion of the immersion-cooled blade 1110, where the vapor rises to the top portion of the blade, and may be directed via one or more vapor deflectors (not shown) back into the second chamber for condensing. Flow of vapor back to the second chamber is facilitated by the liquid-vapor pressure differential between the upper portion of the blade and the corresponding second chamber functioning as the condenser region. As discussed below in connection with FIG. 11B, both the first chamber and the plurality of second chambers of the chassis-level manifold assembly have thermally conductive fin structures extending therein from the heat exchanger to enhance heat transfer. These fin structures may comprise various types of thermally conductive elements. The coolant flowing through the first chamber of each chassis-level manifold assembly yields a temperature at the condenser fins in the respective second chambers of the manifold assembly that is well below the boiling point of the dielectric coolant employed in the immersion-cooled blade. As a result, the vapor condenses over the surfaces of these fins. The condensed liquid may be close in temperature to the vapor, or could be sub-cooled to a much lower temperature, based on operating conditions on the first coolant loop side of the manifold assembly's heat exchanger.

As illustrated in FIG. 11B, each chassis-level manifold assembly 1140 has a plurality of thermally conductive fins 1150 projecting within first chamber 1141 and a plurality of thermally conductive condenser fins 1160 projecting into each second chamber 1142. The plurality of fins 1150 and the plurality of condenser fins 1160, as well as the base structure interfacing the sets of fins, are thermally conductive to facilitate transfer of heat from the plurality of condenser fins 1160 to the rack-level coolant flowing through the rack-level tubing 1133, 1134. As noted, in one example, the vapor-liquid dielectric mixture received from the respective multi-blade center system 1101 undergoes condensation within the second chambers 1142. The vapor-liquid dielectric mixture is received via a flexible tube 1144, which couples to a port in the second chamber 1142 via a hose barb fitting 1146. A similar hose barb fitting 1145 is employed to couple the cooled dielectric fluid back to the multi-blade center system 1101.

Although described hereinabove with reference to rectangular-shaped or circular-shaped pin fins, the concepts presented herein are readily applicable to a variety of different diverging fin configurations. For example, the pin fins might have a trapezoidal, triangular, parallelogram, part-rectangular part-curved, etc., transverse cross-sectional perimeter along at least a portion of their length L.

By way of example, an analysis was carried out for vertical downward-facing pin-fins immersed in vapor of an HFE-7000 dielectric coolant, produced by 3M Corporation. The analysis employed correlations known in the literature which allow for estimation of the condensation film thickness growth on vertical surfaces. The saturated vapor temperature and atmospheric conditions for this coolant is 34° C. The temperature difference between the bottom of the fin and the surrounding vapor was assumed to be 14° C., that is, the fin temperature is at 20° C. if the vapor is at 34° C. For these conditions, and for a pin-fin that is 4.7 mm in height with an outer diameter of 2 mm at the base, the minimum divergence related to outside diameter at the end of the pin-fin, i.e., at the 4.7 mm height, is 2.063 mm. This means that the pin-fin diameter should diverge by more than 63 microns to realize the benefit of the concepts disclosed herein. In an actual design, it may be desirable to diverge the fins by 100 microns, that is, slightly more than the theoretical calculations recommend. It should be noted that for a different dielectric liquid with different thermo-physical properties, such as a different dielectric coolant produced by 3M Corporation (e.g., HFE-7200, FC-72, FC-86) or a refrigerant such as R-134a or R-245a, this divergence dimension will have a different value. Also, if the pin-fin is longer or shorter, or if the temperature difference between the fin surface and the ambient vapor is more or less, then the desired divergence would be different.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:
1. A cooling apparatus comprising:
   a vapor condenser, the vapor condenser comprising:
      a thermally conductive base structure having an operational orientation when the vapor condenser is facilitating vapor condensate formation; and
      at least one thermally conductive condenser fin extending from the thermally conductive base structure a length L, the at least one thermally conductive condenser fin having a varying transverse cross-sectional perimeter along at least a portion of its length L, wherein the transverse cross-sectional perimeter of the at least one thermally conductive condenser fin is configured to increase in a direction of condensate travel along the at least a portion of the at least one thermally conductive condenser fin when the thermally conductive base structure is in the operational orientation and the vapor condenser is facilitating vapor condensate formation.

2. The cooling apparatus of claim 1, wherein the at least one thermally conductive condenser fin has a uniformly changing transverse cross-sectional perimeter along its length L from a proximal end adjacent to the thermally conductive base structure to a remote end remote from the thermally conductive base structure, and wherein the direction of condensate travel is away from the proximal end and towards the remote end of the at least one thermally conductive condenser fin.

3. The cooling apparatus of claim 2, wherein the operational orientation of the thermally conductive base structure is horizontal, and the at least one thermally conductive condenser fin depends downward vertically from the thermally conductive base structure.

4. The cooling apparatus of claim 2, wherein the operational orientation of the thermally conductive base structure is vertical, and the at least one thermally conductive condenser fin extends partially downward from the vertically-oriented, thermally conductive base structure, and wherein the at least one thermally conductive condenser fin has a uniformly increasing transverse cross-sectional perimeter from a proximal end of the at least one thermally conductive condenser fin adjacent to the thermally conductive base structure to a remote end remote from the thermally conductive base structure.

5. The cooling apparatus of claim 1, wherein the operational orientation of the thermally conductive base structure is vertical, and the at least one thermally conductive condenser fin has a uniformly decreasing transverse cross-sectional perimeter from a proximal end of the at least one thermally conductive condenser fin adjacent to the thermally conductive base structure to a remote end remote from the thermally conductive base structure, and wherein the at least one thermally conductive condenser fin extends partially upwards from the vertically-oriented, thermally conductive base structure.

6. The cooling apparatus of claim 1, wherein the transverse cross-sectional perimeter of the at least one thermally conductive condenser fin is one of rectangular-shaped, square-shaped or circular-shaped along at least a portion of its length L.

7. The cooling apparatus of claim 1, wherein the varying transverse cross-sectional perimeter along the at least a portion of the at least one thermally conductive condenser fin's length L is configured to increase a heat transfer coefficient of the at least one thermally conductive condenser fin at the at least a portion thereof by reducing a thickness of a liquid condensate film on a surface of the at least one thermally conductive condenser fin when vapor condensate is forming on the vapor condenser.

8. The cooling apparatus of claim 1, further comprising a plurality of thermally conductive condenser pin-fins extending from the thermally conductive base structure, each thermally conductive condenser pin-fin of the plurality of thermally conductive condenser pin-fins having a uniformly varying transverse cross-sectional perimeter along the at least a portion its length L, wherein the uniformly varying transverse cross-sectional perimeters of the plurality of thermally conductive condenser pin-fins increase in the direction of condensate travel when the thermally conductive base structure is in the operational orientation and the vapor condenser is facilitating vapor condensate formation.

9. A cooling apparatus comprising:
a housing configured to at least partially surround and form a sealed compartment about an electronic device to be cooled;
a dielectric fluid disposed within the sealed compartment, wherein the electronic device to be cooled is at least partially immersed within the dielectric fluid; and
a vapor condenser, the vapor condenser comprising a thermally conductive base structure and a plurality of thermally conductive condenser fins extending from the thermally conductive base structure into the sealed compartment in an upper portion of the sealed compartment, the plurality of thermally conductive condenser fins facilitating cooling of dielectric fluid vapor rising to the upper portion of the sealed compartment, and wherein at least one thermally conductive condenser fin of the plurality of thermally conductive condenser fins has a varying transverse cross-sectional perimeter along at least a portion of its length, the transverse cross-sectional perimeter of the at least one thermally conductive condenser fin increasing in a direction of condensate travel along the at least a portion of the at least one thermally conductive condenser fin, the increasing transverse cross-sectional perimeter being pre-configured to reduce a thickness of dielectric fluid condensate film forming on the at least one thermally conductive condenser fin.

10. The cooling apparatus of claim 9, wherein the operational orientation of the thermally conductive base structure is horizontal, and the plurality of thermally conductive condenser fins depend downward vertically from the thermally conductive base structure.

11. The cooling apparatus of claim 10, wherein the plurality of thermally conductive condenser fins each extend from the thermally conductive base structure a length L into the sealed compartment, and wherein each thermally conductive condenser fin has a varying transverse cross-sectional perimeter along at least a portion of the thermally conductive condenser fin.

12. The cooling apparatus of claim 11, wherein each thermally conductive condenser fin of the plurality of thermally conductive condenser fins has a uniformly varying transverse cross-sectional perimeter from a proximal end adjacent to the thermally conductive base structure to a remote end remote from the thermally conductive base structure, and wherein the transverse cross-sectional perimeter of each thermally conductive condenser fin is one of rectangular-shaped, square-shaped or circular-shaped.

13. The cooling apparatus of claim 9, wherein the transverse cross-sectional perimeter of the plurality of thermally conductive condenser fins is one of rectangular-shaped or square-shaped, and at least one surface of the at least one thermally conductive condenser fin of the plurality of thermally conductive condenser fins has an increasing surface area from a proximal end of the at least one thermally conductive condenser fin adjacent to the thermally conductive base structure to a remote end remote from the thermally conductive base structure.

14. The cooling apparatus of claim 9, wherein the thermally conductive base structure forms a top wall of the housing, and wherein the top wall of the housing is coupled to a liquid-cooled cold plate or an air-cooled heat sink for cooling the plurality of thermally conductive condenser fins, and wherein the cooling apparatus further comprises at least one pump disposed within the sealed compartment for actively pumping dielectric fluid disposed within the sealed compartment towards the electronic device to be cooled to facilitate cooling of the electronic device.

* * * * *